(12) United States Patent
Ren et al.

(10) Patent No.: US 10,651,043 B2
(45) Date of Patent: May 12, 2020

(54) PROCESS INTEGRATION METHOD TO TUNE RESISTIVITY OF NICKEL SILICIDE

(71) Applicant: Applied Materials, Inc., Santa Clara, CA (US)

(72) Inventors: He Ren, San Jose, CA (US); Minrui Yu, Sunnyvale, CA (US); Mehul B. Naik, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/544,349

(22) Filed: Aug. 19, 2019

(65) Prior Publication Data

US 2019/0371610 A1    Dec. 5, 2019

Related U.S. Application Data

(62) Division of application No. 15/988,854, filed on May 24, 2018, now Pat. No. 10,388,533.

(60) Provisional application No. 62/521,100, filed on Jun. 16, 2017.

(51) Int. Cl.
    *H01L 23/48*      (2006.01)
    *H01L 21/285*     (2006.01)
    (Continued)

(52) U.S. Cl.
    CPC ...... *H01L 21/2855* (2013.01); *C23C 14/0682* (2013.01); *C23C 14/3464* (2013.01);
    (Continued)

(58) Field of Classification Search
    CPC .......... C23C 14/0682; H01L 21/32053; H01L 23/53209
    (Continued)

(56) References Cited

U.S. PATENT DOCUMENTS

| 4,424,101 A | 1/1984 | Nowicki |
| 6,599,644 B1 * | 7/2003 | Zekentes ............. H01L 21/0485 257/750 |

(Continued)

FOREIGN PATENT DOCUMENTS

| JP | 05-021347 A | 1/1993 |
| JP | 11-209872 A | 8/1999 |

*Primary Examiner* — Nitin Parekh
(74) *Attorney, Agent, or Firm* — Patterson + Sheridan LLP

(57) ABSTRACT

Methods for depositing a low resistivity nickel silicide layer used in forming an interconnect and electronic devices formed using the methods are described herein. In one embodiment, a method for depositing a layer includes positioning a substrate on a substrate support in a processing chamber, the processing chamber having a nickel target and a silicon target disposed therein, the substrate facing portions of the nickel target and the silicon target each having an angle of between about 10 degrees and about 50 degrees from the target facing surface of the substrate, flowing a gas into the processing chamber, applying an RF power to the nickel target and concurrently applying a DC power to the silicon target, concurrently sputtering silicon and nickel from the silicon and nickel targets, respectively, and depositing a $Ni_xSi_{1-x}$ layer on the substrate, where x is between about 0.01 and about 0.99.

20 Claims, 6 Drawing Sheets

(51) Int. Cl.
*H01L 21/67* (2006.01)
*H01L 23/532* (2006.01)
*H01L 21/768* (2006.01)
*C23C 14/06* (2006.01)
*C23C 14/34* (2006.01)
*C23C 14/35* (2006.01)
*H01J 37/34* (2006.01)
*H01L 21/3205* (2006.01)

(52) U.S. Cl.
CPC ........ *C23C 14/352* (2013.01); *H01J 37/3417* (2013.01); *H01J 37/3429* (2013.01); *H01J 37/3435* (2013.01); *H01J 37/3447* (2013.01); *H01L 21/32053* (2013.01); *H01L 21/67138* (2013.01); *H01L 21/76877* (2013.01); *H01L 23/53209* (2013.01); *H01L 23/53271* (2013.01)

(58) Field of Classification Search
USPC .......................................... 257/741, 766, 754
See application file for complete search history.

(56) References Cited

U.S. PATENT DOCUMENTS

| | | |
|---|---|---|
| 2004/0097060 A1 | 5/2004 | San et al. |
| 2007/0052039 A1* | 3/2007 | Iinuma .............. H01L 21/28052 |
| | | 257/384 |
| 2007/0095651 A1 | 5/2007 | Ye et al. |
| 2007/0254471 A1 | 11/2007 | Kameyama et al. |
| 2007/0254477 A1 | 11/2007 | Muraoka et al. |
| 2007/0254480 A1* | 11/2007 | Matsuda ........... H01L 21/28518 |
| | | 438/682 |
| 2008/0311711 A1 | 12/2008 | Hampp et al. |
| 2010/0273324 A1 | 10/2010 | Lin et al. |
| 2014/0102877 A1 | 4/2014 | Yamazaki |
| 2014/0225103 A1 | 8/2014 | Tezuka et al. |
| 2015/0279635 A1 | 10/2015 | Subramani et al. |
| 2016/0268127 A1 | 9/2016 | Yamazaki |
| 2016/0372371 A1* | 12/2016 | Singh ................ H01L 21/28518 |
| 2017/0053784 A1 | 2/2017 | Subramani et al. |
| 2017/0053946 A1 | 2/2017 | Matsuzaki et al. |
| 2017/0256572 A1 | 9/2017 | Yamazaki |
| 2017/0263773 A1 | 9/2017 | Yamazaki |

* cited by examiner

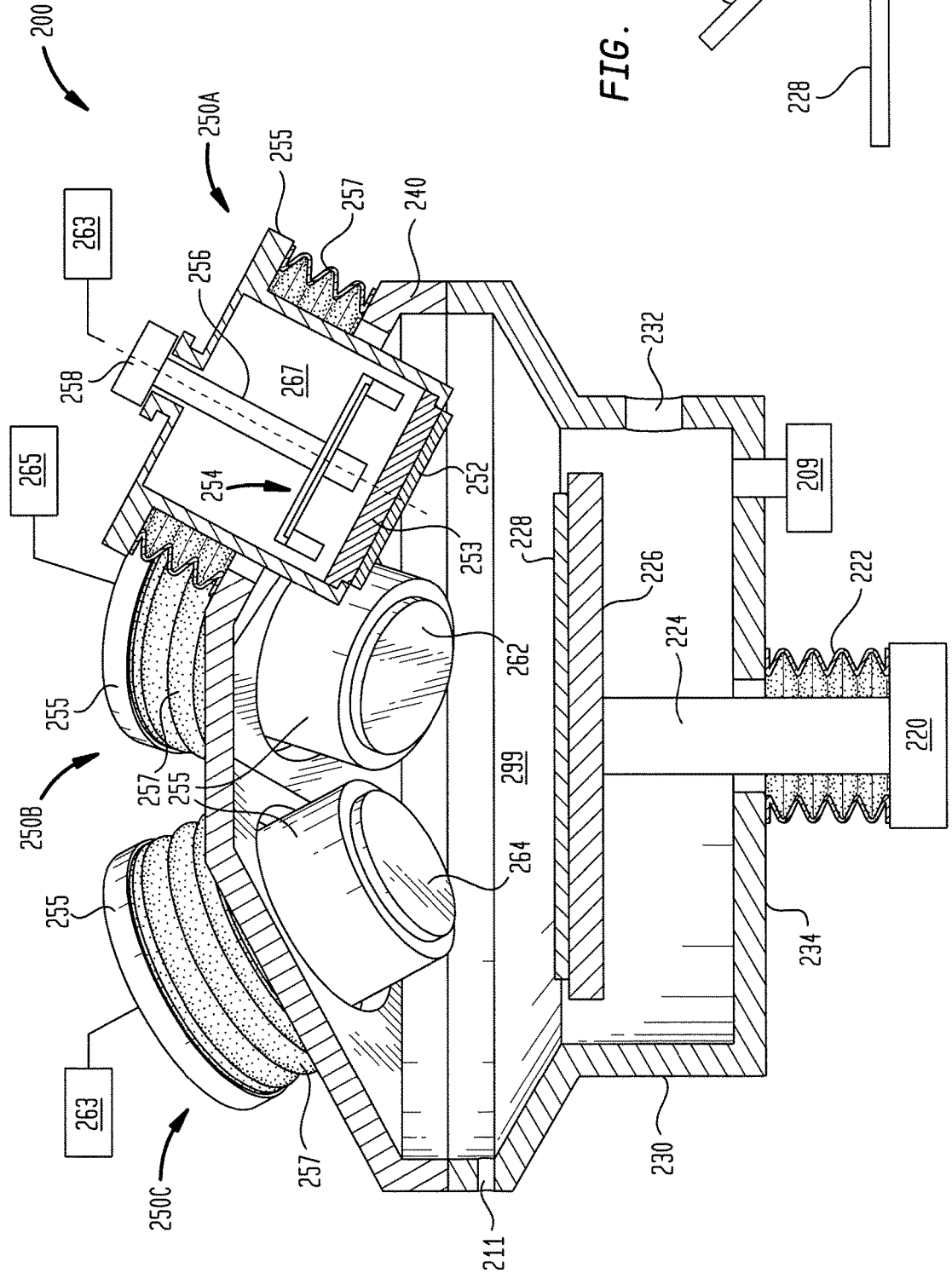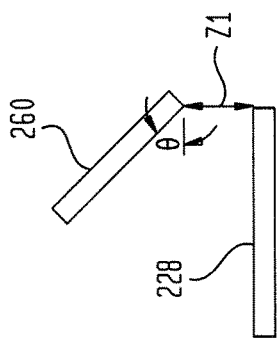

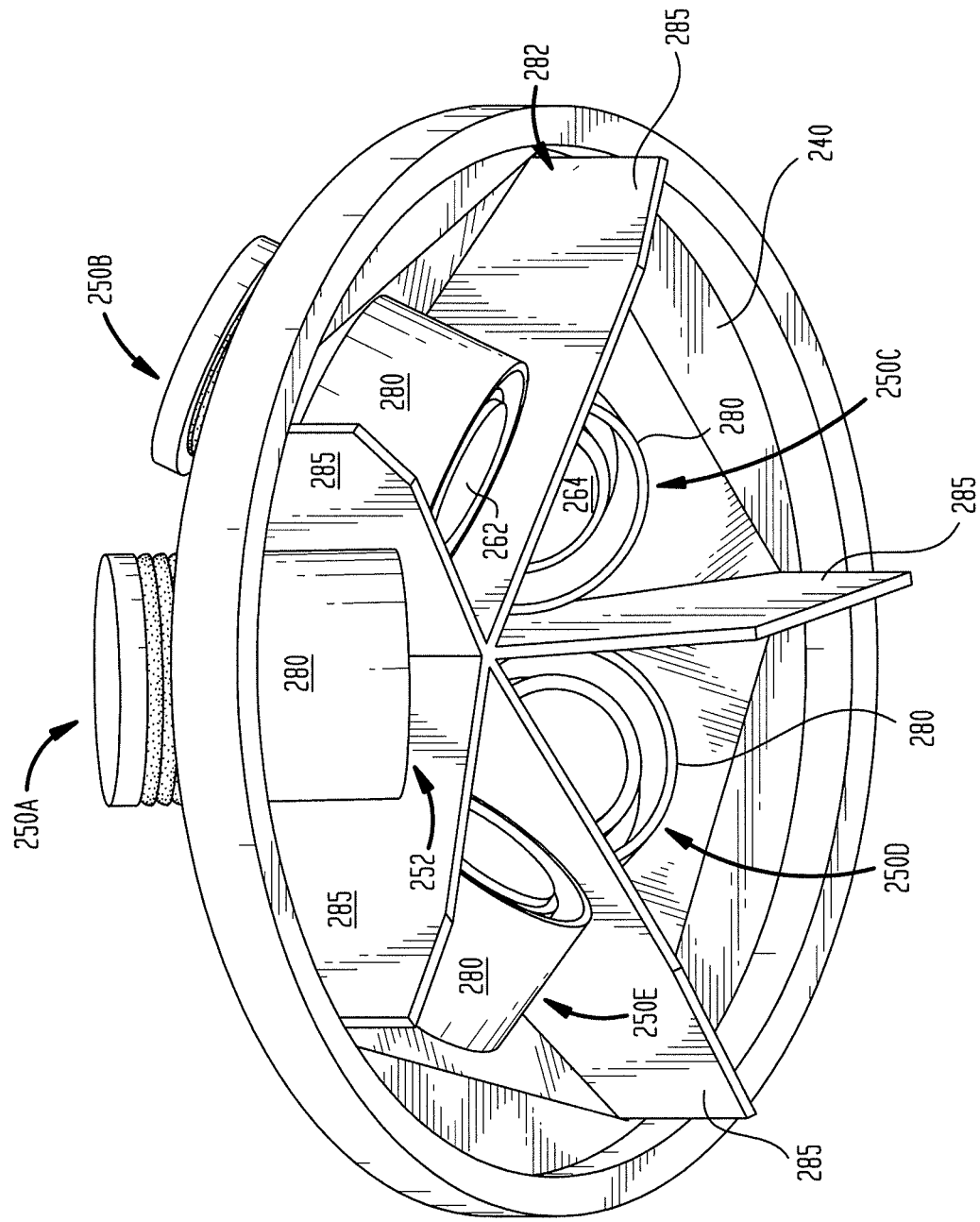

PROCESS INTEGRATION METHOD TO TUNE RESISTIVITY OF NICKEL SILICIDE

CROSS-REFERENCE TO RELATED APPLICATIONS

This application is a divisional of U.S. patent application Ser. No. 15/988,854, filed May 24, 2018, now U.S. Pat. No. 10,388,533, issued on Aug. 20, 2019, which claims benefit of U.S. Provisional Patent Application Ser. No. 62/521,100, filed on Jun. 16, 2017. Each of the aforementioned related patent applications is herein incorporated by reference in its entirety.

BACKGROUND

Field

Embodiments described herein generally relate to the field of semiconductor device manufacturing, and more particularly, to methods of forming metal silicide interconnects using a co-sputtering physical vapor deposition (PVD) process in a multi-cathode PVD chamber, and electronic devices formed using the methods.

Description of the Related Art

As the circuit density for next generation devices increases and transistor dimensions continue to shrink, the properties of the materials used for wire interconnects begins to dominate device performance for major performance metrics including power consumption, resistance-capacitance (RC) delay, and reliability. Copper has been used for wire interconnects in advanced USLI and VSLI technologies for the past two decades because copper generally exhibits relatively low resistivity, and thus high conductivity. However, as the widths of the interconnect wiring of a device shrink to dimensions at or below electron mean free path (eMFP) of the interconnect wiring material, the effective resistivity of the material is increased as a result of undesirable side-wall electron scattering at the surface of the interconnect wiring and the grain boundary interfaces thereof. Thus, the effective resistivity of copper, typically used in interconnects, begins to increase for copper interconnects having a width below copper's eMFP of 39 nm and increases dramatically for interconnects having a width of 20 nm or below. In addition, the barrier layer used with copper interconnects to prevent undesirable diffusion of the copper material into surrounding dielectric material contributes to an increased overall resistivity of the wire interconnect.

Accordingly, there is a need in the art for alternative conductor materials.

SUMMARY OF THE DISCLOSURE

Embodiments described herein generally relate to methods of manufacturing a semiconductor device and, in particular, relate to methods of co-sputtering a nickel silicide layer onto a substrate in a multi-cathode physical vapor deposition (PVD) chamber.

In one embodiment, a method for depositing a layer includes positioning a substrate on a substrate support in a processing chamber, the processing chamber having a nickel target and a silicon target disposed therein, the substrate facing portions of the nickel target and the silicon target each having an angle of between about 10 degrees and about 50 degrees from the target facing surface of the substrate, flowing a gas into the processing chamber, applying an RF power to the nickel target and concurrently applying a DC power to the silicon target, concurrently sputtering silicon and nickel from the silicon and nickel targets, respectively, and depositing a $Ni_xSi_{1-x}$ layer on the substrate, where x is between about 0.01 and about 0.99.

In another embodiment, a method of forming a device includes positioning a substrate on a substrate support within a processing chamber, the substrate having a plurality of features disposed thereon and a plurality of openings disposed between the plurality of features, flowing a gas into the processing chamber, applying an RF power to a nickel target and concurrently applying a DC power to a silicon target, wherein the nickel target and the silicon target are disposed in the processing chamber and the surfaces thereof facing the substrate each have an angle to the surface of the substrate facing the targets of between about 10 degrees and about 50 degrees, concurrently sputtering silicon and nickel from the silicon and nickel targets, respectively, and depositing a $Ni_xSi_{1-x}$ layer, where x is between about 0.01 and about 0.99, on the substrate to form a plurality of interconnects.

In another embodiment, an electronic device features a patterned substrate comprising a dielectric layer and a plurality of interconnect features disposed in the dielectric layer, wherein the plurality of interconnect features comprise $Ni_xSi_{1-x}$ having an effective resistivity about 30 μohm-cm or less, x is between about 0.4 and about 0.6, and one or more of the interconnect features has a width of less than about 20 nm and a height about 2 times the width or more.

In another embodiment, a method of depositing a layer comprising nickel and silicon includes positioning a substrate on a substrate support in a processing chamber, the processing chamber having a nickel target and a silicon target, the nickel target and the silicon target having an angle to a surface of the substrate support of between about 10 degrees and about 50 degrees, flowing an inert gas into the processing chamber, applying an RF power to the nickel target and a DC power to the silicon target, where a ratio of the RF power and the DC power is between about 1:1 and about 1:12, and co-sputtering a $Ni_xSi_{1-x}$ layer onto the substrate, the $Ni_xSi_{1-x}$ layer having a resistivity of less than about 200 μohm-cm, where x is between about 0.01 and 0.99.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 2A is a cross-sectional view of a multi-cathode processing chamber used to practice the embodiments disclosed herein.

FIG. 2B shows the relative positions of a target and a substrate during deposition in the processing chamber of FIG. 2A.

FIG. 2C is a schematic view showing a shield assembly disposed in the chamber lid of a processing chamber used to practice the methods disclosed herein.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally describe a method for depositing a layer of nickel silicide onto a substrate, including over previously formed layers on the substrate, using a co-sputtering physical vapor deposition (PVD) process in a multi-cathode PVD chamber, and in particular, controlling the resulting resistivity, composition, and crystal orientation of the deposited nickel silicide layer by controlling the power and the ratio of power applied to the nickel and silicon targets.

Figure 1:
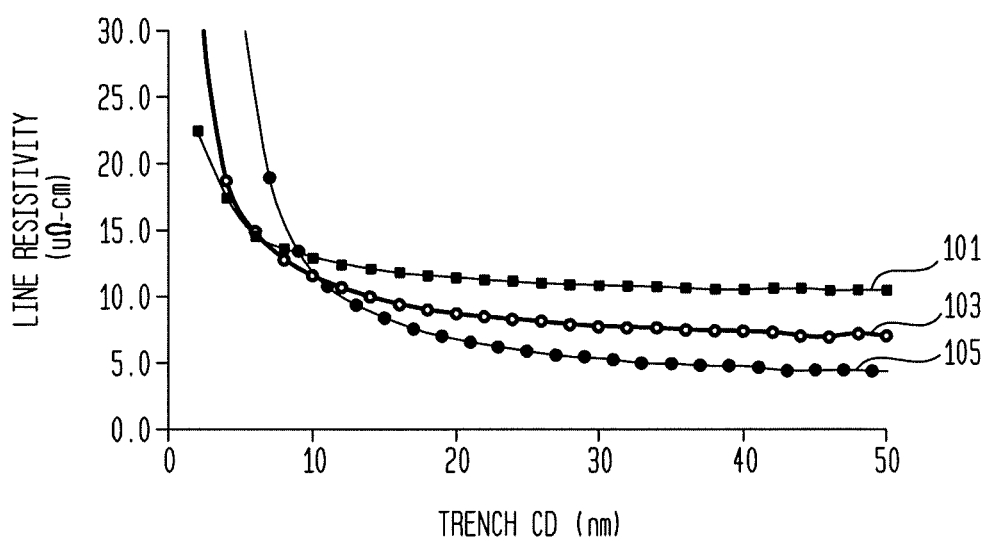
FIG. 1 shows the relationship between scaling of wire interconnects to 50 nm and below and material selection for those wire interconnects.

FIG. 1 shows the relationship between scaling of a trench to a thickness of 50 nm and below and material selection for wire interconnects, where scaling refers to the changes in line resistivity (wire resistivity) of selected materials as wires narrow to and beyond the electron mean free path eMFP of the material. In FIG. 1 the interconnect wires are in trenches disposed in a dielectric material and have widths of 50 nm and below (trench CD) with an aspect ratio (depth to width) of 2:1. FIG. 1 shows the relationship between the effective resistance of copper 105, cobalt 103, and nickel silicide 101, wherein a liner/barrier layer is interposed between the copper, cobalt or nickel silicide and the dielectric material to prevent diffusion of copper, cobalt or nickel silicide atoms into the surrounding dielectric material.

As used herein, effective resistivity refers to the measured resistivity of a material, and not the bulk resistivity of the material. As can be seen from FIG. 1, the effective resistivity of the three materials begins to meaningfully increase as the widths of the wire interconnects are scaled to 20 nm and below, but the increase of resistivity of the cobalt 103 (having an eMFP of 9.5) with decreasing trench CD is incrementally less than that of copper 105, making cobalt 103 a promising material for trench CD's of 10 nm and below. In fact, the effective resistance of copper, which is less than that of cobalt for features in the 10 to 50 nm width range, becomes greater than that of cobalt at feature sizes slightly smaller than 10 nm wide. The incremental increase in the effective resistivity of nickel silicide 101 (having an eMFP of less than 10 nm depending on the nickel to silicon composition) is less than that of the cobalt 103 making nickel silicide 101 a promising material for wire interconnects having a trench CD of 7 to 8 nm and below, and the effective resistance of cobalt becomes greater than that of nickel silicide at a line width of around 6 nm.

FIG. 2A is a cross-sectional view of a multi-cathode physical vapor deposition (PVD) processing chamber 200 used for the deposition of nickel silicide onto a substrate 228, according to the methods described herein. FIG. 2C is a schematic view showing a cathode shield configuration disposed in the chamber lid 240 of the processing chamber 200. The cathode shield configuration shown in FIG. 2C is not shown FIG. 2A, however, the methods described herein include the use of a cathode shield configuration, such as that shown in FIG. 2C, with the processing chamber 200. In this embodiment, the processing chamber 200 is configured to process single substrate, such as the substrate 228 disposed on a substrate support 226 in FIG. 2A. In other embodiments, the methods described herein are used in a processing chamber configured to process multiple substrates disposed on a substrate turntable.

Herein, the processing chamber 200 features one or more sidewalls 230, a chamber lid 240, and a chamber bottom 234 which define a processing volume 299. The processing volume 299 is fluidly coupled to a vacuum 209 such as one or more dedicated vacuum pumps, and has a substrate support 226 disposed therein. The substrate support 226 includes a shaft 224, surrounded by a substrate support bellows 222 outside of the processing chamber, sealingly extending through the chamber bottom 234, the shaft 224 raises and lowers the substrate support 226 to facilitate transfer of the substrate 228 to and from the processing chamber 200. The substrate 228 is loaded into the processing volume 299 through a sealable opening 232 in one of the one or more sidewalls 230, which is conventionally sealed with a door or a valve (not shown) during the deposition processes. In some embodiments, the shaft 224 is further coupled to an actuator 220 which rotates the shaft 224, and thereby the substrate 228 disposed on the substrate support 226, during processing which, under some process conditions, improves the uniformity of the thickness of the deposited films on the surface of the substrate 228.

The processing chamber 200 includes a plurality of cathodes 250A-E, herein plurality of cathodes comprises five cathodes (250D-E are shown in FIG. 2C), disposed through openings in the chamber lid 240 where each of the plurality of cathodes 250A-E is configured to sputter one or more materials onto the substrate 228. In this embodiment, a first cathode 250A is configured to sputter nickel from a nickel target 252 and a second cathode 250B is configured to concurrently sputter (co-sputter) silicon from a silicon target 262 thereby depositing a homogenous nickel silicide layer on the surface of the substrate 228. Herein, a third cathode 250C is configured to sputter titanium from a titanium target 264 in the presence of a reactive gas containing nitrogen, such as nitrogen or ammonia, thereby depositing a titanium nitride layer on the surface of the substrate 228. In other embodiments, the third cathode 250C is configured to sputter titanium nitride from a titanium nitride target.

One or more of the plurality of cathodes 250A-E includes a magnet assembly 254 disposed within a housing volume 267 defined by the cathode housing 255 and a target backing plate 253, the target backing plate 253 having a target, such as the nickel target 252 disposed thereon. The magnet assembly 254 is coupled to a rotating shaft 256 which is coupled to a motor 258 that rotates the rotating shaft 256, and thus the magnet assembly 254 over the rear-non sputtered, side of the target backing plate 253. Each of the plurality of cathodes 250A-E are coupled to a power supply, such as the RF power supply 263 coupled to the first cathode 250A and to the third cathode 250C or the DC power supply 265 coupled to the second cathode 250B. In other embodiments, the DC power supply 265 is a pulsed DC power supply. Sputtering and/or reactive gases are provided to the processing chamber through a gas inlet 211.

Each of the plurality of cathodes 250A-E include a bellows 257 and an angular adjustment mechanism (not shown) coupled to the exterior of the chamber lid 240 and to the cathode housing 255. The bellows 257 is used to maintain the vacuum condition of the processing volume 299 by preventing the passage of atmospheric gases into the processing volume 299, and leakage of processing gases from the processing volume 299 to the surrounding environment. The angular adjustment mechanism is used to alter, and then fix, the position the cathode housing 255 and thus a target disposed therein, such as the nickel target 252 of the first cathode 250A, at an angle relative to the surface of the substrate 228 described in further detail with reference to FIG. 2B.

FIG. 2B shows the relative position of a target 260, such as any of the targets of the plurality of cathodes 250A-E in the processing chamber 200, to a substrate 228 during deposition. Herein, the substrate 228 has a diameter of 300 mm and the target 260 has a diameter of less than the diameter of the substrate 228, such as less than about 300 mm, such as between about 100 mm and about 300 mm. During processing, the substrate 228 is moved to a processing position by raising the substrate support 226, shown in FIG. 2A, to where a horizontal plane of the surface of the substrate 228 is spaced from the target 260 by a vertical distance Z1. The vertical distance Z1 is measured from the location of the target that is closest to the horizontal plane of the surface of the substrate 228. Herein, Z1 is between about 100 mm and about 400 mm, such between about 150 mm and about 350 mm, such as between about 200 mm and about 300 mm, such as between about 225 mm and about 275 mm. The plane of the surface of the target 260 is angled with respect to the horizontal plane of the surface of the substrate 228 at an angle θ, where theta is between about 10 degrees and about 50 degrees, such as between about 20 degrees and about 40 degrees, between about 20 degrees and about 30 degrees, or between about 30 degrees and about 40 degrees.

FIG. 2C is a schematic view showing a shield assembly 282 disposed in the chamber lid 240 of the processing chamber 200. The shield assembly 282 includes a plurality of vertical walls 285 extending between each of the plurality of cathodes 250A-E where the plurality of vertical walls 285 are coupled at center line and extend radially outward therefrom. The plurality of vertical walls 285 are positioned to prevent cross-talk and/or cross-target contamination between two or more of the plurality of cathodes 250A-E during processing by providing a physical barrier therebetween. Cross-talk refers to an undesirable electrical interference from one cathode's power supply, such as RF power supply 263, with another cathodes power supply, such as DC power supply 265, in a co-sputtering process. Cross-target contamination refers to the undesirable deposition of material from one target onto another target in a co-sputtering and/or sequential sputtering process.

In some embodiments, the processing chamber 200 further includes one or more cylindrical shields 280 coupled to one or more of the plurality of cathodes 250A-E as shown in FIG. 2C. In those embodiments, the one or more cylindrical shields 280 surround the cathode housings 255 and thus the targets disposed therein of one or more of the plurality of cathodes 250A-C. The cylindrical shields 280 are configured to prevent cross-talk and cross-target contamination by providing a physical barrier between the cathodes in the chamber. In other embodiments, the processing chamber 200 includes the cylindrical shields 280 and does not include the shield assembly 282.

Figure 3A:
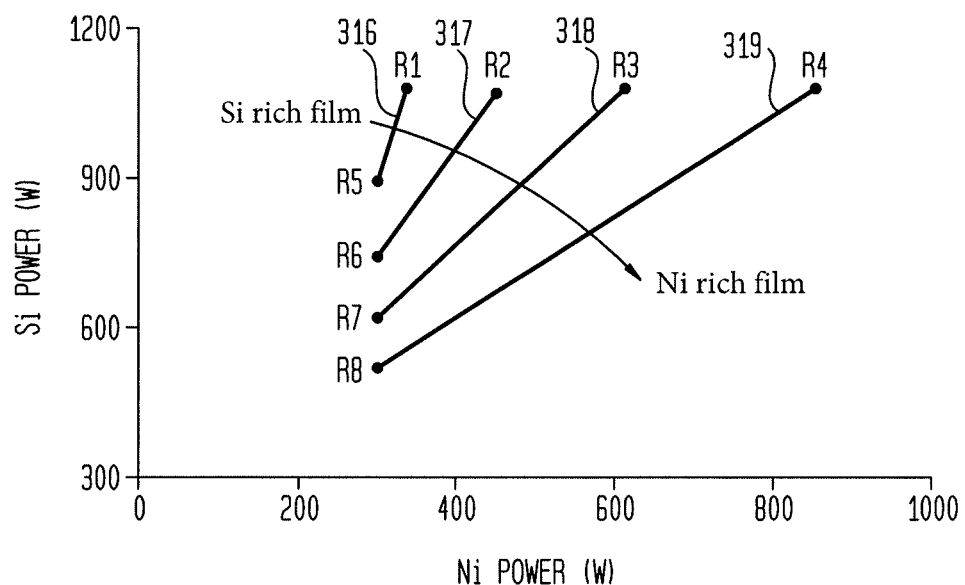
FIG. 3A shows the resistivity of nickel silicide layers deposited according to the embodiments disclosed herein.

FIG. 3A shows the resistivity of nickel silicide layers deposited according to embodiments disclosed herein. Lines 316, 317, 318, 319 each represent the ratio of the power supplied to the nickel cathode and the power supplied to the silicon cathode during a co-sputtering PVD process, where the power supplied to the nickel cathode, such as the first cathode 250A, compared to the power supplied to the silicon cathode, such as the second cathode 250B, increases from a first power ratio represented by line 316 to a fourth power ratio represented by line 319 thereby increasing the ratio of nickel to silicon in the deposited layers, such that nickel silicide layers deposited at the first power ratio 316 are silicon rich layers and the nickel silicide layers deposited at the fourth power ratio 319 are nickel rich layers. The resistivity of the resulting nickel silicide layers R1-R8, deposited using the power ratios of lines 316-319 are shown in Table 1. R1 and R5 were each deposited using the first power ratio 316, R2 and R6 were each deposited using the second power ratio 317, R3 and R7 were each deposited using the third power ratio 318, and R4 and R8 were each deposited using the fourth power ratio 319.

As shown in FIG. 3, R1-R4 were all deposited at the same DC power while the RF power to the nickel target was varied and R4-8 were all deposited at the same RF power while the DC power to the silicon target was varied. The effective resistivity of the material layer of ratios R1 to R8 were calculated by measuring the sheet resistance of the deposited film, measuring the thickness of the deposited film, and extrapolating the effective resistivity of the film from the sheet resistance and film thickness measurements. Unexpectedly, the resistivity of the deposited layers did not vary linearly with increasing nickel concentration, for example while a nickel silicide composition at ratio R2 shows a significant decrease in effective resistivity as compared to a nickel silicide composition at ratio R1 which would be expected as the nickel silicide composition at ratio R2 has a higher concentration of the more conductive nickel, the nickel silicide compositions at ratios R3 and R4 have higher concentrations of nickel than those one at ratio R2, but also have an increased effective resistivity from the nickel silicide composition at ratio R2. Also unexpected, is the difference in resistivity in nickel silicide layers deposited using the same power ratio, such as the first power ratio 316, but at different RF and DC power levels, where the concentrations of nickel and silicon in the a nickel silicide compositions at ratios R1 and R4 are substantially the same.

While not being bound to any particular theory, it is believed that, in addition to nickel and silicon concentrations, the crystal orientation of nickel silicide layers, deposited according to methods described herein, can be controlled by tuning the power levels, and thus the corresponding power ratios, applied to the nickel and silicon cathodes to deposit the nickel silicide layers with a desired crystal orientation and/or a desired effective resistivity. Further, the methods described herein can be used to deposit a nickel silicide layer having the desired crystal orientation without the need for an anneal process thereafter, or at least without the need for a high temperature anneal process. This is beneficial at interconnect levels where high temperatures are undesirable due to the low thermal budget of low K dielectric materials.

TABLE 1

| | Nickel to silicide power ratio | Resistivity (μohm-cm) | Nickel to silicide power ratio | Resistivity (μOhm-cm) |
|---|---|---|---|---|
| First Power Ratio (line 316) | R1 | 38 | R5 | 63 |
| Second Power Ratio (line 317) | R2 | 17 | R6 | 43 |
| Third Power Ratio (line 318) | R3 | 47 | R7 | 47 |
| Fourth Power Ratio (line 319) | R4 | 46 | R8 | 65 |

Figure 3B:
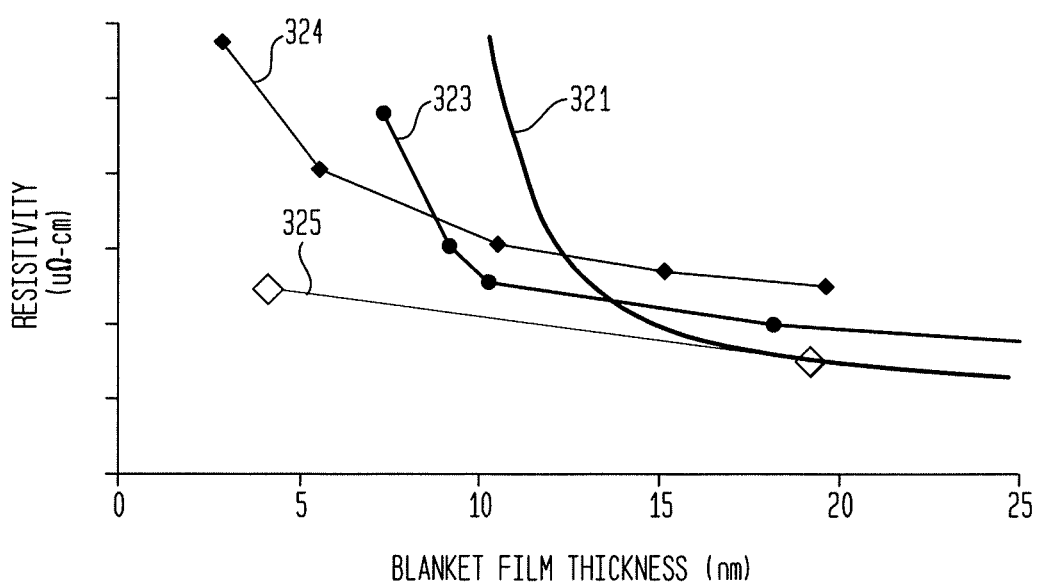
FIG. 3B compares the resistivity of layers copper, annealed cobalt, annealed ruthenium, and nickel silicide, where the nickel silicide layers are deposited according to the methods described herein.

FIG. 3B compares the effective resistivity of layers of different materials, such as copper 321, annealed cobalt 323, annealed ruthenium 324, and nickel silicide 325 where the nickel silicide 325 is deposited according to the methods described herein. The effective resistivity was measured for layer thicknesses of 25 nm and below. As shown in FIG. 3b, nickel silicide 325 layers deposited according to methods described herein, continue to have comparably low effective resistivity as compared to other interconnect materials at blanket film thicknesses of less than about 10 nm making nickel silicide a suitable material for sub-10 nm interconnect widths.

Figure 4:
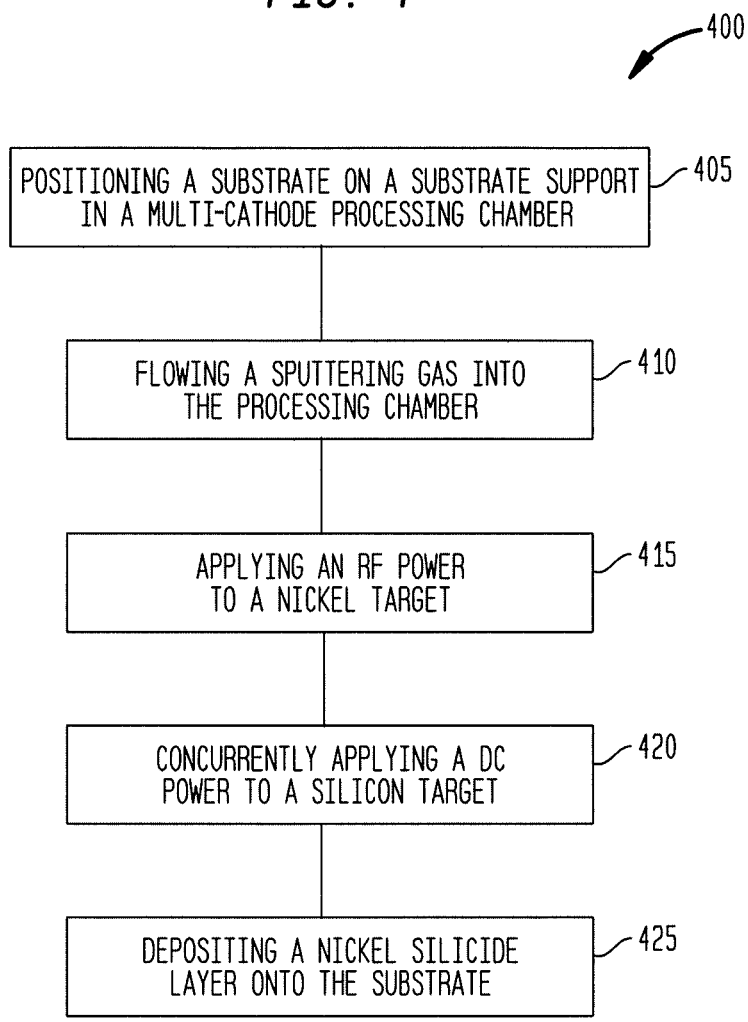
FIG. 4 is a flow diagram setting forth a method of depositing a nickel silicide layer onto a substrate, according to embodiments disclosed herein.
Figure 5A:
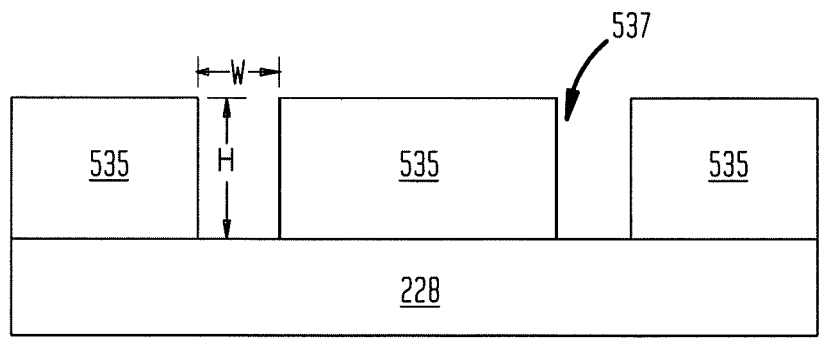
FIGS. 5A-5C illustrate the formation of wire interconnects, using the method set forth FIG. 4.
Figure 5B:
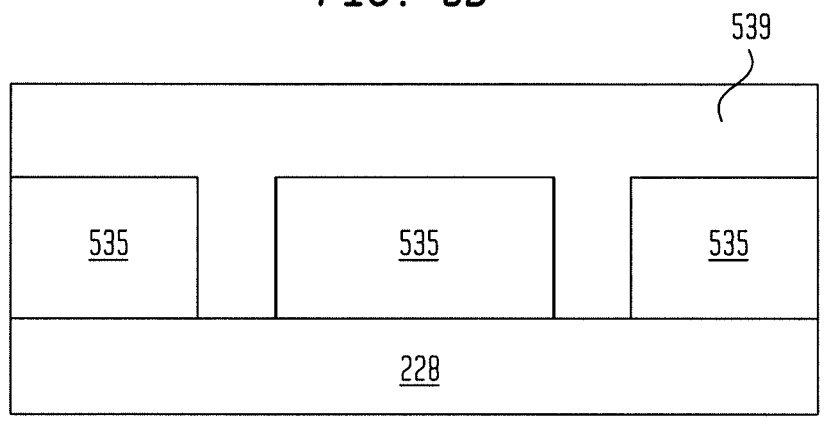
Figure 5C:
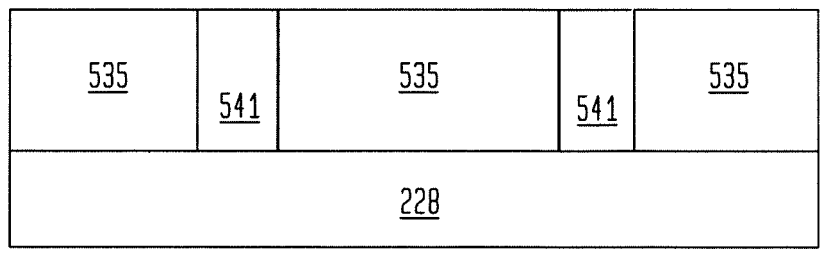

FIG. 4 is a flow diagram setting forth a method of depositing a nickel silicide layer onto a substrate, or onto features disposed on a substrate. FIGS. 5A-5C illustrate the formation of wire interconnects, using the method 400 set forth in FIG. 4. At activity 410 the method 400 includes positioning a substrate, such as a patterned substrate, on a substrate support in a multi-cathode processing chamber. A patterned substrate is illustrated in FIG. 5A where the pattern comprises a plurality of features 535 having a height H and a plurality of openings 537 having a width W disposed therebetween. Herein, the plurality of features 535 are formed of a dielectric material, such as silicon oxides, SiN, SiOC, SIC, or low-k polymers, such as a polyamide, or combinations thereof. The width of the openings is less than about 20 nm, such as less than about 15 nm, less than about 10 nm, less than about 8 nm, less than about 7 nm, such as less than about 5 nm. The height H of the plurality of features is equal to or more than about two times the width W of the plurality of openings 537. The processing chamber is maintained at a pressure of less than about 1 mTorr, such as between 0.5 mTorr and 1 mTorr. In some embodiments, the patterned substrate further includes a barrier layer (not shown), such as Ta, TaN, It, W, WN, or combinations thereof. In those embodiments, the barrier layer is disposed over the plurality of features 535 and serves as a liner in the plurality of openings 537 disposed between the plurality of features 535. In some embodiments, the barrier layer is deposited in the same processing chamber as is a subsequently deposited nickel silicide layer, and thus without the substrate breaking vacuum between deposition of the barrier layer and deposition of the nickel silicide layer.

At activity 410 the method 400 includes flowing a sputtering gas into the processing chamber, where the sputtering gas is an inert gas such as argon, helium, or nitrogen.

At activity 415 the method 400 includes applying an RF power to a nickel target and forming a first sputtering plasma adjacent to the face thereof. The surface of the nickel target is disposed in the processing chamber at an angle to the surface of the substrate support, and this to the surface of the substrate disposed thereon, of between about 10 degrees and about 50 degrees. The RF power is between about 100 watts and about 1000 watts. Herein, the RF power is coupled to a backing plate having the nickel target disposed thereon. In another embodiment, the RF power is coupled to the nickel target.

At activity 420 the method 400 includes applying DC power to a silicon target and forming a second sputtering plasma adjacent to the face thereof. The silicon target is disposed in the processing chamber at an angle to the surface of the substrate support, and the surface of the substrate disposed thereon, of between about 10 degrees and about 50 degrees. The DC power is between about 600 watts and about 1200 watts and is applied to the silicon target concurrently with applying the RF power to the nickel target. Herein, the DC power is coupled to a backing plate having the silicon target disposed thereon. In another embodiment, the DC power is coupled to the silicon target. The silicon target comprises amorphous silicon, polycrystalline silicon, crystalline silicon, or combinations thereof. Herein, the ratio of the RF power and the DC power is between about 1:1 and about 1:12.

At activity 425 the method 400 includes depositing a homogenous nickel silicide layer 539 ($Ni_xSi_{1-x}$, where x is between 0.01 and 0.99, such as between 0.1 and 0.9) by co-sputtering material from the nickel and silicon targets onto the substrate and/or the features disposed thereon. FIG. 5B illustrates depositing the nickel silicide layer 539 onto the plurality of features 535 disposed on the substrate 228. FIG. 5C illustrates a plurality of interconnects 541 formed according to the methods described above where portions of the nickel silicide layer 539 were removed from the surface of the plurality of features 535 using a suitable process, such as an etch or a chemical mechanical polishing process, to form an electronic device.

The method 400 hereof is useful to tune the resistivity and composition of nickel silicide layers by adjusting the RF power, the DC power, and the ratio therebetween, by adjusting the nickel and silicon target angles, and by adjusting the pressure of the processing chamber. For example, in one embodiment the method 400 is used to deposit a low resistivity $Ni_xSi_{1-x}$ layer, where x is between about 0.4 and about 0.6, for example where x is about 0.5. The low resistivity $Ni_xSi_{1-x}$ layer has a resistivity less than about 30 μohm-cm, such as between about 10 μohm-cm and about 30 μohm-cm, at a thickness of less than about 20 nm, and a full crystalline orientation. The low resistivity $Ni_xSi_{1-x}$ layer is deposited in a processing chamber having a pressure of between about 0.6 mTorr and about 0.7 mTorr by co-sputtering nickel and silicon. The faces of the nickel and silicon targets each have an angle of between about 20 degrees and about 40 degrees with respect to the surface of the substrate support, and thus from the surface of the substrate disposed thereon. In this embodiment, the ratio of RF power and DC power is between about 1:1.6 and about 1:4 where the RF power is between about 300 watts and about 500 watts and the DC power is between about 800 watts and about 1200 watts.

In another embodiment, the method 400 is used to deposit a medium resistivity $Ni_xSi_{1-x}$ layer, where x is more than about 0.6. The medium resistivity layer has a resistivity of between about 30 μohm-cm and about 60 μohm-cm, such as between about 30 μohm-cm and about 50 μohm-cm, at a thickness of less than about 20 nm. The medium resistivity $Ni_xSi_{1-x}$ layer is deposited in a processing chamber having a pressure of between about 0.5 mTorr and about 0.8 mTorr by co-sputtering nickel and silicon where the nickel and silicon targets each have an angle of between about 20 degrees and about 30 degrees from the surface of the substrate support, and from the surface of the substrate disposed thereon. In this embodiment, the ratio of RF power to DC power is more than about 1:2.4, such as more than about 1:1.6, where more than refers to increasing RF power compared to DC power. The RF power is more than about 500 watts, for example between about 500 watts and about 1000 watts, and the DC power is between about 800 watts and about 1200 watts.

In another embodiment, the method 400 is used to deposit a high resistivity $Ni_xSi_{1-x}$ layer, where x is less than about 0.4, such as less than about 0.33. The high resistivity $Ni_xSi_{1-x}$ layer has a resistivity of more than about 60 μohm-cm, such as between about 60 μohm-cm and 200 μohm-cm at a thickness less than about 20 nm. The high resistivity $Ni_xSi_{1-x}$ layer is deposited in a processing chamber having a pressure of between about 0.5 mTorr and about 1 mTorr by co-sputtering nickel and silicon. The nickel and silicon targets each have an angle of between about 30 degrees and about 40 degrees from the surface of the substrate support, and from the surface of the substrate disposed thereon. In this embodiment, the ratio of RF power to DC power is between about 1:12 and about 1:2. The RF power is between about 100 watts and about 300 watts and the DC power is between about 600 watts and about 1200 watts.

In another embodiment, the method 400 further comprises depositing a TiN passivation layer on the nickel silicide layer, where the TiN passivation layer is deposited in the same processing chamber as the nickel silicide layer, and thus without the substrate breaking vacuum. The TiN layer is deposited by flowing a sputtering gas comprising argon and a gas reactive with titanium, such as nitrogen, $NH_4$, or combinations thereof, into the processing chamber, applying an RF power to a titanium target, forming a sputtering plasma of the sputtering gas, and depositing a TiN passivation layer onto the nickel silicide layer. In another embodiment, the target comprises TiN and the sputtering gas comprises argon, helium, nitrogen, or combinations thereof.

In some embodiments, the silicon nitride layers are annealed at a temperature of below about 400° C.

The methods described above allow for the deposition of nickel silicide layers having tunable composition (nickel and silicon concentrations), crystal orientation, and resistivity by adjusting the processing parameters of the multi-cathode processing chamber. With tunable resistivity, nickel silicide layers deposited according to embodiments disclosed herein can be used for applications requiring medium or high resistivity, such as devices requiring an embedded resistor, such as a plate resistor, or a line resistor. Further, the low resistivity nickel silicide layers formed according the embodiments described herein are suitable for use as interconnects in the sub 20 nm regime as the eMFP's of nickel silicides, and thus their effective resistivity, allow for scaling of line widths and other conductor feature widths to dimensions less than what is currently available from other known materials.

While the foregoing is directed to embodiments of the present disclosure, other and further embodiments of the disclosure may be devised without departing from the basic scope thereof, and the scope thereof is determined by the claims that follow.

The invention claimed is:

1. An electronic device, comprising:
a patterned substrate comprising a dielectric layer and a plurality of interconnect features disposed in the dielectric layer, wherein
the plurality of interconnect features comprise a $Ni_xSi_{1-x}$ layer,
x is between about 0.4 and about 0.6,
the $Ni_xSi_{1-x}$ layer has an effective resistivity of 30 μohm-cm or less, and
one or more of the interconnect features has a width of less than about 20 nm and a height of about 2 or more times the width.

2. The electronic device of claim 1, further comprising a barrier layer disposed between the dielectric layer and the plurality of interconnect features.

3. The electronic device of claim 1, further comprising a titanium nitride layer disposed on the $Ni_xSi_{1-x}$ layer.

4. The electronic device of claim 1, wherein the plurality of interconnect features are formed from a homogenous nickel silicide layer.

5. The electronic device of claim 4, further comprising a barrier layer disposed between the dielectric layer and the plurality of interconnect features.

6. The electronic device of claim 4, further comprising a titanium nitride layer disposed on the $Ni_xSi_{1-x}$ layer.

7. The electronic device of claim 4, wherein the homogenous nickel silicide layer has a full crystalline orientation.

8. An electronic device, comprising:
a patterned substrate comprising a plurality of features disposed in a dielectric layer, wherein
the plurality of features comprise a $Ni_xSi_{1-x}$ layer where x is more than about 0.6,
the $Ni_xSi_{1-x}$ layer has a thickness of less than 20 nm, and
an effective resistivity of the $Ni_xSi_{1-x}$ layer is between about 30 μohm-cm and about 60 μohm-cm.

9. The electronic device of claim 8, further comprising a barrier layer disposed between the dielectric layer and the features.

10. The electronic device of claim 8, further comprising a titanium nitride layer disposed on the $Ni_xSi_{1-x}$ layer.

11. The electronic device of claim 8, wherein one or more of the plurality of features form an embedded resistor.

12. The electronic device of claim 8, wherein the plurality of features are formed from a homogenous nickel silicide layer.

13. The electronic device of claim 12, wherein one or more of the plurality of features form an embedded resistor.

14. An electronic device, comprising:
a patterned substrate comprising a plurality of features disposed in a dielectric layer, wherein
the plurality of features comprise a $Ni_xSi_{1-x}$ layer where x is less than about 0.4,
the $Ni_xSi_{1-x}$ layer has a thickness of less than 20 nm, and
an effective resistivity of the $Ni_xSi_{1-x}$ layer is more than about 60 μohm-cm.

15. The electronic device of claim 14, further comprising a barrier layer disposed between the dielectric layer and the features.

16. The electronic device of claim 14, further comprising a titanium nitride layer disposed on the $Ni_xSi_{1-x}$ layer.

17. The electronic device of claim 14, wherein one or more of the plurality of features form an embedded resistor.

18. The electronic device of claim 14, wherein the plurality of features are formed from a homogenous nickel silicide layer.

19. The electronic device of claim 18, wherein one or more of the features form an embedded resistor.

20. The electronic device of claim 19, wherein the effective resistivity is less than about 200 μohm-cm.

* * * * *